(12) United States Patent
Kim et al.

(10) Patent No.: US 8,866,522 B1
(45) Date of Patent: Oct. 21, 2014

(54) DIGITAL DELAY-LOCKED LOOP CIRCUIT USING PHASE-INVERSION ALGORITHM AND METHOD FOR CONTROLLING THE SAME

(71) Applicant: Hongik University Industry—Academia Cooperation, Seoul (KR)

(72) Inventors: Jongsun Kim, Seongnam-si (KR); Sangwoo Han, Seoul (KR)

(73) Assignee: Hongik University Industry—Academia Cooperation, Seoul (KR)

( * ) Notice: Subject to any disclaimer, the term of this patent is extended or adjusted under 35 U.S.C. 154(b) by 0 days.

(21) Appl. No.: 14/283,279

(22) Filed: May 21, 2014

(30) Foreign Application Priority Data

Jun. 25, 2013 (KR) .......................... 10-2013-0072977

(51) Int. Cl.
*H03L 7/06* (2006.01)
*H03L 7/08* (2006.01)

(52) U.S. Cl.
CPC .................................... *H03L 7/0802* (2013.01)
USPC .......................................... 327/157; 327/148

(58) Field of Classification Search
CPC .......... H03L 7/0891; H03L 7/093; H03L 7/18
See application file for complete search history.

(56) References Cited

U.S. PATENT DOCUMENTS

| 5,745,004 A | * | 4/1998 | Mycynek et al. | 329/308 |
| 6,069,524 A | * | 5/2000 | Mycynek et al. | 329/308 |
| 7,629,820 B2 | * | 12/2009 | Heyne et al. | 327/158 |
| 7,880,519 B2 | * | 2/2011 | Senda et al. | 327/161 |
| 8,102,196 B1 | * | 1/2012 | Zhang | 327/156 |
| 8,106,691 B2 | * | 1/2012 | Sogawa et al. | 327/156 |
| 2004/0174724 A1 | * | 9/2004 | Mitev et al. | 363/40 |
| 2008/0074159 A1 | * | 3/2008 | Heyne et al. | 327/158 |
| 2009/0125262 A1 | * | 5/2009 | Boerstler et al. | 702/79 |
| 2009/0125857 A1 | * | 5/2009 | Boerstler et al. | 716/6 |
| 2009/0146711 A1 | * | 6/2009 | Senda et al. | 327/158 |
| 2009/0146713 A1 | * | 6/2009 | Senda et al. | 327/161 |
| 2011/0001527 A1 | * | 1/2011 | Lee | 327/158 |
| 2011/0291715 A1 | * | 12/2011 | Sogawa et al. | 327/157 |
| 2012/0074996 A1 | * | 3/2012 | Nagaraj et al. | 327/157 |
| 2012/0169420 A1 | * | 7/2012 | Liu | 330/251 |
| 2012/0306552 A1 | * | 12/2012 | Erdogan | 327/158 |

FOREIGN PATENT DOCUMENTS

KR          10-0543910 B1     1/2006

* cited by examiner

*Primary Examiner* — Adam Houston
(74) *Attorney, Agent, or Firm* — Sherr & Jiang, PLLC

(57) ABSTRACT

Disclosed herein are a delay-locked loop circuit using a phase inversion locking algorithm and a method of controlling the same. There is provided a delay-locked loop circuit using a phase inversion locking algorithm, including a phase inversion controller configured to control whether or not to use the phase inversion locking algorithm by determining a phase error between an input clock signal and an output clock signal, an inverter configured to invert the input clock signal and output the inverted input clock signal, a multiplexer configured to receive the input clock signal and the inverted input clock signal of the inverter and output the input clock signal in response to the control signal of the phase inversion controller or the inverted input clock signal, and a delay-locked loop connected to the output terminal of the multiplexer and configured to perform phase synchronization in response to the output signal of the multiplexer.

22 Claims, 14 Drawing Sheets

(a)

(b)

DIGITAL DELAY-LOCKED LOOP CIRCUIT USING PHASE-INVERSION ALGORITHM AND METHOD FOR CONTROLLING THE SAME

CROSS REFERENCE TO RELATED APPLICATION

The present application claims the benefit of Korean Patent Application No. 10-2013-0072977 filed in the Korean Intellectual Property Office on 25 Jun. 2013, the entire contents of which are incorporated herein by reference.

BACKGROUND OF THE INVENTION

1. Technical Field

The present invention relates to a delay-locked loop circuit using a phase inversion locking algorithm and a method of controlling the same and, more particularly, to a delay-locked loop circuit capable of implementing a wide operating frequency range, a short locking time, low power consumption, a small chip area, and improved jitter performance by reducing the number of delay units within a digitally-controlled delay line by half to a maximum extent by applying a phase inversion locking algorithm to the delay-locked loop circuit and a method of controlling the delay-locked loop circuit.

2. Description of the Related Art

In order to improve power consumption and the data transfer rate, a Delay-Locked Loop (DLL) or a Phase-Locked Loop (PLL) is used as an Input/Output (I/O) interface between chips in high-speed integrated circuits, such as DRAM, microprocessors, and communication chips.

In general, a delay-locked loop circuit is basically divided into two types: an analog delay-locked loop circuit and a digital delay-locked loop circuit depending on the type of feedback loop that controls the amount of delay.

The analog delay-locked loop circuit adopts a method of storing control information for controlling the amount of delay in the capacitor of a feedback loop. In general, the analog delay-locked loop circuit has a simple structure, the accurate delay control ability, and an excellent jitter characteristic. It is however difficult to easily apply the analog delay-locked loop circuit to various systems because the analog delay-locked loop circuit has low transplantation due to a characteristic sensitive to a change in the process of an analog circuit and sensitively responds to the noise of a control signal. Furthermore, it is difficult for the analog delay-locked loop circuit to have a wide operating frequency due to a long locking time and a non-linear characteristic of a voltage control delay line.

In contrast, the digital delay-locked loop circuit adopts a method of storing control information for controlling the amount of delay in digital bits through a limited state machine within a feedback loop. Accordingly, the digital delay-locked loop circuit has excellent transplantation to various systems and can support low power standby mode because it is resistant to the noise of a control signal and insensitive to a change of a digital block process. Furthermore, the digital delay-locked loop circuit may have a relatively rapid locking time and a wide operating frequency characteristic as compared with an analog method because it uses a digitally-controlled delay line. However, the digital delay-locked loop circuit may not precisely control delay because the digital delay-locked loop circuit uses discontinuous digital control information unlike the analog delay-locked loop circuit that uses continuous analog control information and thus it has low resolution of a controllable delay amount.

FIG. 1 is a signal diagram showing a locking algorithm which is commonly used in a delay-locked loop circuit.

Referring to FIG. 1, in the conventional delay-locked loop circuit, in order to synchronize the phases of an input clock signal $IN_{CLK}$ and an output clock signal $OUT_{CLK}$, the amount of delay time generated by an internal digitally-controlled delay line block must be at least one cycle $t_{cycle}$ or more of the input clock signal. Such a delay time is the most basic factor that limits the improvement of performance and availability of a delay-locked loop circuit that needs to implement a wide operating frequency range, high delay resolution, low power consumption, a small chip area, and high jitter performance.

PRIOR ART DOCUMENT

Patent Document

Korean Patent No. 100543910

SUMMARY OF THE INVENTION

Accordingly, the present invention has been made keeping in mind the above problems occurring in the prior art, and an object of the present invention is to provide a delay-locked loop circuit using a phase inversion locking algorithm and a method of controlling the same, which are capable of having a wide operating frequency range, a short locking time, low power, a small chip area, and an improved jitter characteristic by minimizing the amount of generated delay time that limits the improvement of performance and availability of the delay-locked loop circuit.

Another object of the present invention is to provide a delay-locked loop circuit using a phase inversion locking algorithm and a method of controlling the same, which are capable of eliminating a phenomenon in which the operating frequency range of the delay-locked loop circuit is reduced due to a duty cycle error of an input clock signal when a phase inversion locking algorithm is used.

In accordance with an aspect of the present invention, there is provided a delay-locked loop circuit using a phase inversion locking algorithm, including a phase inversion controller configured to control whether or not to use the phase inversion locking algorithm by determining a phase error between an input clock signal and an output clock signal, an inverter configured to invert the input clock signal and output the inverted input clock signal, a multiplexer configured to receive the input clock signal and the inverted input clock signal of the inverter and output the input clock signal in response to the control signal of the phase inversion controller or the inverted input clock signal, and a delay-locked loop connected to the output terminal of the multiplexer and configured to perform phase synchronization in response to the output signal of the multiplexer.

In accordance with another aspect of the present invention, there is provided a method of controlling a delay-locked loop circuit using a phase inversion locking algorithm, including determining whether or not to use the phase inversion locking algorithm and performing a phase synchronization process when whether or not to use the phase inversion locking algorithm is determined and an input clock signal or an inverted input clock signal is selected and used as an input clock signal of the delay-locked loop circuit.

DETAILED DESCRIPTION

Hereinafter, some exemplary embodiments of the present invention are described in detail with reference to the accompanying drawings.

Figure 1:
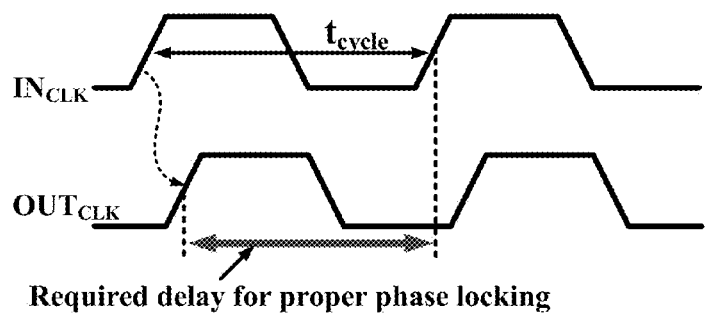
FIG. 1 is a signal diagram showing a locking algorithm which is commonly used in a delay-locked loop circuit.
Figure 2:
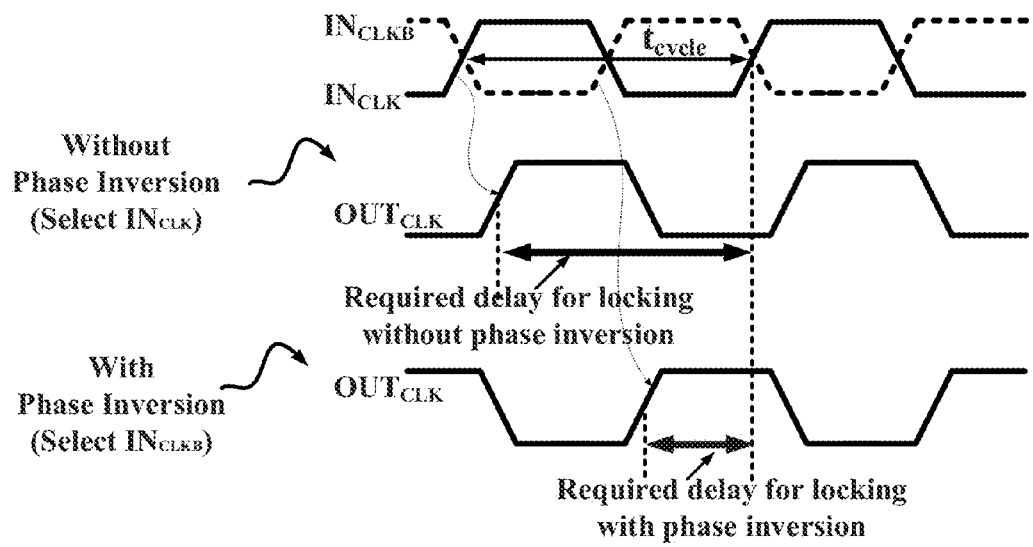
FIG. 2 is a signal diagram showing the basic principle and effects of a delay-locked loop circuit using a phase inversion locking algorithm in accordance with an embodiment of the present invention.

FIG. 2 is a signal diagram showing the basic principle and effects of a delay-locked loop circuit using a phase inversion locking algorithm in accordance with an embodiment of the present invention. The uppermost waveforms show an input clock signal $IN_{CLK}$ and an inverted input clock signal $IN_{CLKB}$, the middle waveform shows a delay time 't1' required for phase synchronization before the phase inversion locking algorithm is applied (i.e., when an input clock signal is used), and the lowermost waveform shows a delay time 't2' required for phase synchronization after the phase inversion locking algorithm is applied (i.e., when an inverted input clock signal is used).

Referring to FIG. 2, if a phase error between the input clock signal $IN_{CLK}$ and the output clock signal $OUT_{CLK}$ is the half cycle '$t_{cycle}/2$' or more of the input clock signal and the inverted input clock signal $IN_{CLKB}$ is used instead of the input clock signal, the phase inversion locking algorithm in accordance with an embodiment of the present invention may reduce a phase error by the half cycle of the input clock signal. If the inverted input clock signal is used as described above, when the amount of delay time generated by a digitally-controlled delay line has only to become is greater than the half cycle of the input clock signal, there is advantage in that phases can be synchronized.

Figure 3:
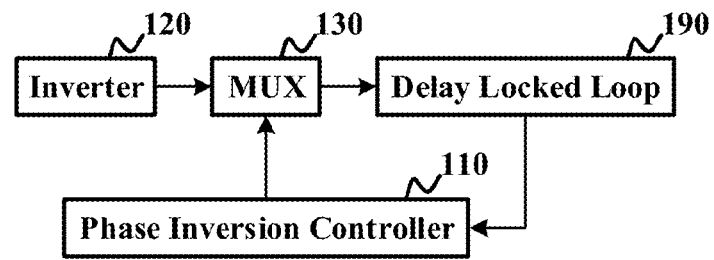
FIG. 3 is a functional block diagram showing a delay-locked loop circuit using a phase inversion locking algorithm in accordance with an embodiment of the present invention.
Figure 4:
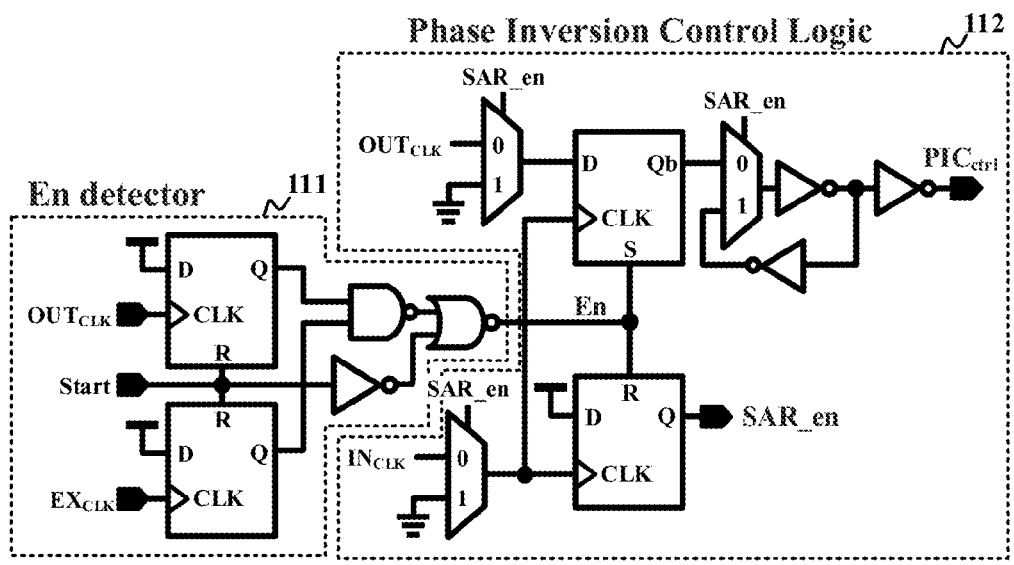
FIG. 4 shows the construction of a phase inversion controller.
Figure 5:
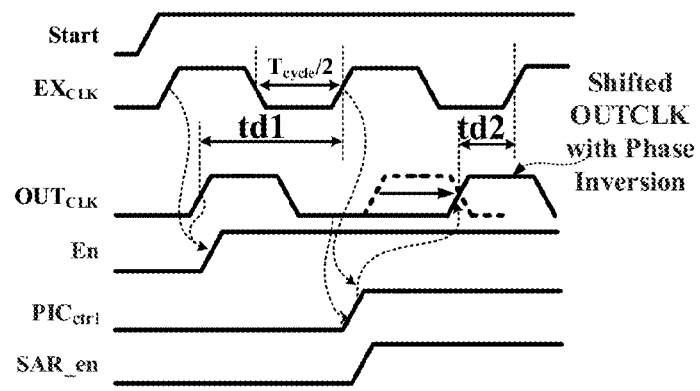
FIG. 5 is a signal flowchart according to the operation of the phase inversion controller shown in FIG. 4.

FIG. 3 is a functional block diagram showing a delay-locked loop circuit using a phase inversion locking algorithm in accordance with an embodiment of the present invention, FIG. 4 shows the construction of a phase inversion controller, and FIG. 5 is a signal flowchart according to the operation of the phase inversion controller shown in FIG. 4.

Referring to FIG. 3, the delay-locked loop circuit using a phase inversion locking algorithm according to the present embodiment includes a phase inversion controller (PIC) 110, an inverter 120, a multiplexer 130, and a delay-locked loop 190.

The operation of the delay-locked loop circuit according to the present embodiment is basically divided into a process of determining whether or not to use a phase inversion locking algorithm and a phase synchronization process. The process of determining whether or not to use a phase inversion locking algorithm is performed using the phase inversion controller 110, the inverter 120, and the multiplexer 130, and the phase synchronization process is performed using the delay-locked loop 190.

The phase inversion controller 110 detects the generation of rising edges of the first input clock signal and an output clock signal, initiates the operation of a phase inversion locking algorithm in response to the detection, determines whether or not a phase error between the input clock signal and the output clock signal is greater than the half cycle of the input clock signal by comparing the phase of the input clock signal with the phase of the output clock signal, and controls whether or not to use the phase inversion locking algorithm based on a result of the determination. That is, the phase inversion controller 110 performs control so that the phase inversion locking algorithm is used if a phase error between the input clock signal and the output clock signal is greater than the half cycle of the input clock signal and performs control so that the phase inversion locking algorithm is not used if a phase error between the input clock signal and the output clock signal is not is greater than the half cycle of the input clock signal.

The inverter 120 receives the input clock signal, inverts the input clock signal, and outputs an inverted input clock signal.

The multiplexer 130 receives the input clock signal and the inverted input clock signal output by the inverter 120 as input clock signals. The multiplexer 130 outputs the inverted input clock signal if a phase inversion locking algorithm is used and outputs the input clock signal without change if the phase inversion locking algorithm is not used in response to the control signal of the phase inversion controller 110.

The delay-locked loop 190 is connected to the output terminal of the multiplexer 130 and is configured to receive the output signal of the multiplexer 130 and perform phase synchronization.

Referring to FIGS. 4 and 5, a clock generation detector 111 detects the generation of rising edges of the first input clock signal $IN_{CLK}$ and an output clock signal $OUT_{CLK}$ and generates an operation control signal En that initiates the operation of a phase inversion determination unit 112. The reason why the phase inversion determination unit 112 is driven after the generation of rising edges of the input clock signal $IN_{CLK}$ and the output clock signal $OUT_{CLK}$ is detected as described above is to prevent the operation of the phase inversion determination unit 112 from being initiated before the output clock signal $OUT_{CLK}$ is generated after the input clock signal $IN_{CLK}$ is input to the delay-locked loop circuit.

The phase inversion determination unit 112 starts its operation in response to the operation control signal En of the clock generation detector 111. The phase inversion determination unit 112 determines whether or not a phase error between the input clock signal $IN_{CLK}$ and the output clock signal $OUT_{CLK}$ is greater than the half cycle of the input clock signal $IN_{CLK}$ by comparing the phase of the input clock signal $IN_{CLK}$ with the phase of the output clock signal $OUT_{CLK}$, determines whether or not to use the phase inversion locking algorithm based on a result of the determination, generates a phase inversion determination signal $PIC_{ctrl}$ that controls whether or not to use the inverted input clock signal $IN_{CLKB}$, and sends the generated phase inversion determination signal $PIC_{ctrl}$ to the multiplexer 130.

That is, when the operation control signal En is generated, the phase inversion determination unit 112 compares the phase of the input clock signal $IN_{CLK}$ with the phase of the output clock signal $OUT_{CLK}$ and generates the phase inversion determination signal $PIC_{ctrl}$ based on a result of the comparison.

If a value of the output clock signal $OUT_{CLK}$ is '0' at the second rising edge of the input clock signal $IN_{CLK}$, the phase inversion determination unit 112 determines that a delay time 'td1' that needs to be generated through a 3-stage Digitally-Controlled Delay Line (DCDL) 140 is greater than the half cycle of the input clock signal $IN_{CLK}$ and thus generates the phase inversion determination signal $PIC_{ctrl}$ of '1'. In response thereto, the delay-locked loop circuit performs the phase synchronization process using the phase inversion locking algorithm.

If a value of the output clock signal $OUT_{CLK}$ is '1' at the second rising edge of the input clock signal $IN_{CLK}$, the phase inversion determination unit 112 determines that a delay time 'td2' that needs to be generated through the digital delay-locked loop is less than the half cycle of the input clock signal $IN_{CLK}$ and thus generates the phase inversion determination signal $PIC_{ctrl}$ of '0'. In such a case, the delay-locked loop circuit performs the phase synchronization process without using the phase inversion locking algorithm.

The multiplexer 130 receives the input clock signal $IN_{CLK}$ and the inverted input clock signal $IN_{CLKB}$ received from the inverter 120. When the phase inversion determination signal $PIC_{ctrl}$ of '1' is received in order to use the phase inversion locking algorithm, the multiplexer 130 connects the inverted input clock signal $IN_{CLKB}$ to the output of the multiplexer. If the phase inversion locking algorithm is not used, the phase inversion determination signal $PIC_{ctrl}$ of '0' is input to the multiplexer 130, and thus the input clock signal $IN_{CLK}$ is connected to the output of the multiplexer without change.

Figure 6:
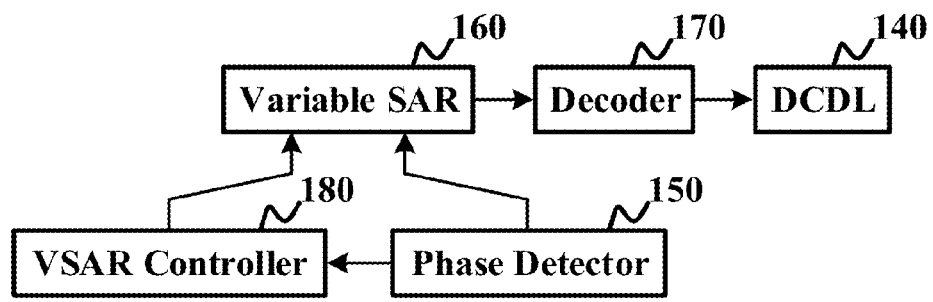
FIG. 6 is a schematic functional block diagram of a delay-locked loop.

FIG. 6 is a schematic functional block diagram of the delay-locked loop.

Referring to FIG. 6, the delay-locked loop 190 includes the Digitally-Controlled Delay Line (DCDL) 140, a phase detector (PD) 150, a variable Successive Approximation Register (SAR) 160, a decoder 170, and a Successive Approximation Register (SAR) controller 180.

The DCDL 140 receives the input clock signal $IN_{CLK}$ or the inverted input clock signal $IN_{CLKB}$ from the multiplexer 130 and functions to reduce a phase error between the input clock signal $IN_{CLK}$ and the output clock signal $OUT_{CLK}$ by controlling an internal delay time.

The phase detector 150 detects a phase error between the input clock signal $IN_{CLK}$ (including the inverted input clock signal $IN_{CLKB}$) and the output clock signal $OUT_{CLK}$. The phase detector 150 compares the phase of the input clock signal $IN_{CLK}$ with the phase of the output clock signal $OUT_{CLK}$, generates a phase comparison signal Comp that controls the output digital bits of the variable SAR 160, whether or not the phases have been locked, and generates a lock determination signal Lock that controls the SAR controller 180.

The variable SAR 160 performs a binary bit search or a sequential bit search in response to the phase comparison signal Comp of the phase detector 150 and at the same time generates output digital bits suitable for removing a phase error between the input clock signal $IN_{CLK}$ and the output clock signal $OUT_{CLK}$.

The decoder 170 functions to convert the output digital bits of the variable SAR 160 into code suitable for the DCDL 140.

The SAR controller 180 resets the variable SAR 160, increases the number of valid output bits, and controls a mode switching operation into sequential search mode in response to the phase comparison signal Comp and the lock determination signal.

Figure 7:
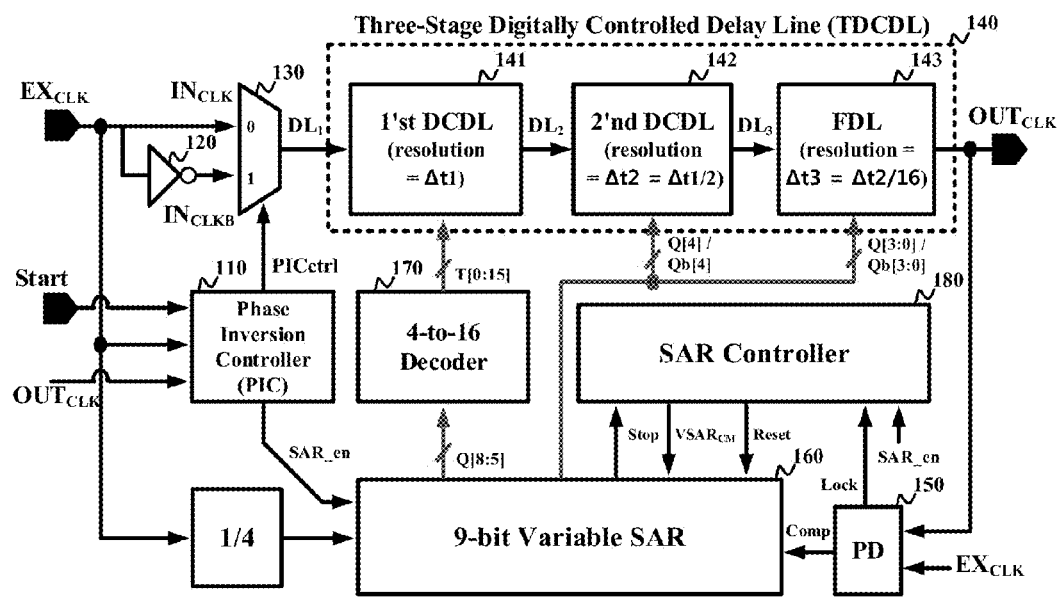
FIG. 7 shows the construction of a delay-locked loop circuit using a phase inversion locking algorithm in accordance with an embodiment of the present invention.
Figure 8:
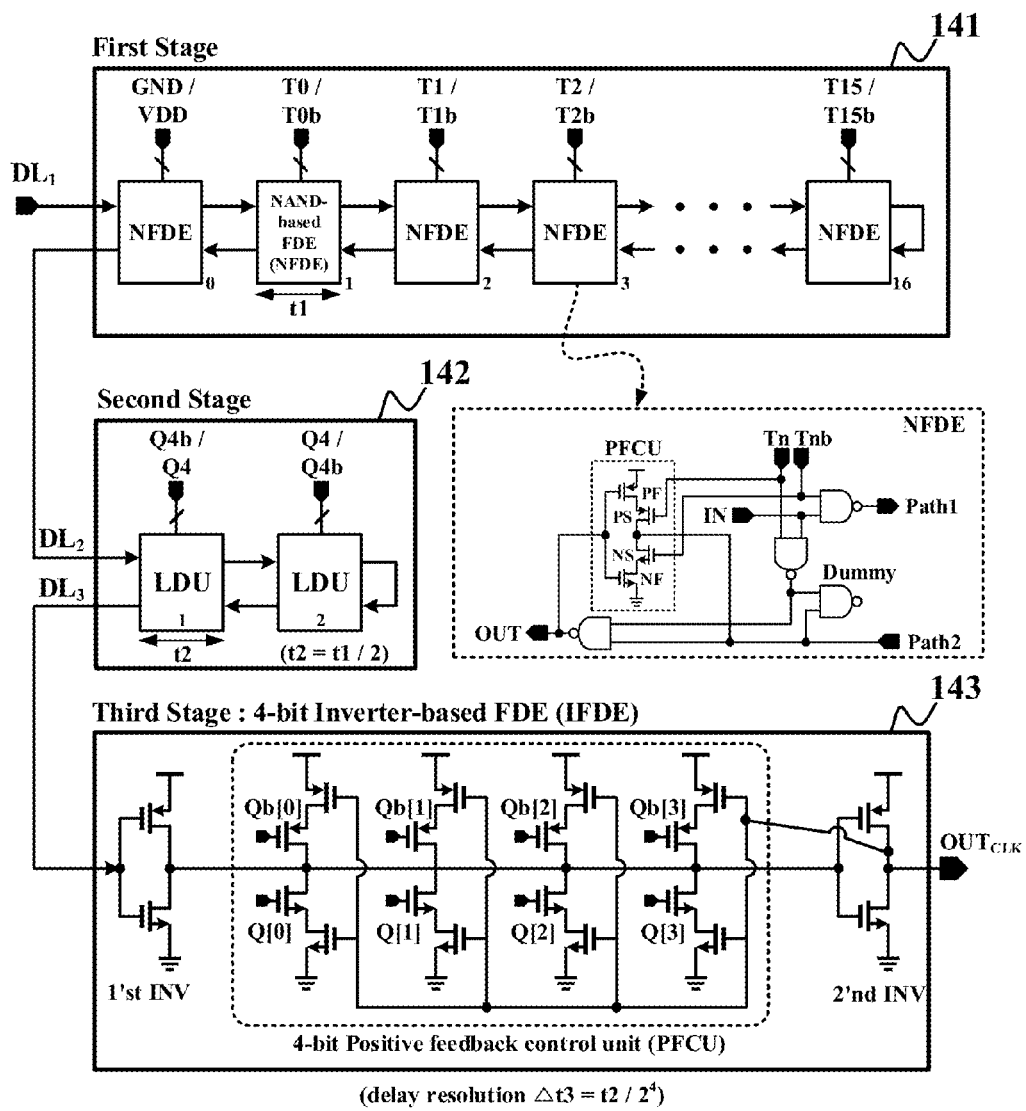
FIG. 8 shows the construction of a 3-stage digitally-controlled delay line shown in FIG. 7.
Figure 9A:
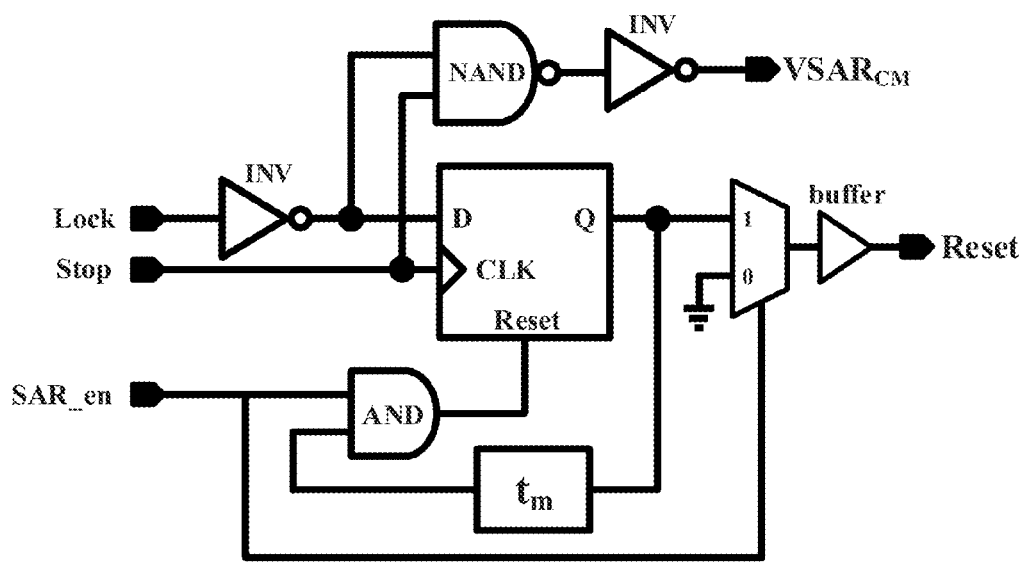
FIG. 9A shows the construction of a Successive Approximation Register (SAR) controller.
Figure 9B:
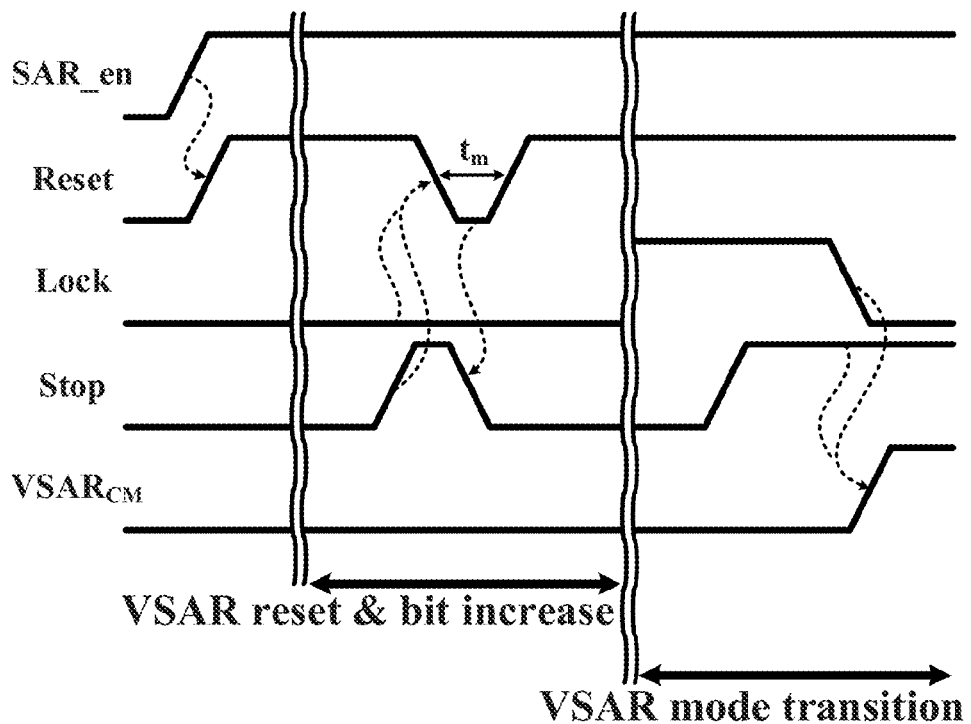
FIG. 9B is a signal flowchart according to the operation of the SAR controller shown in FIG. 9A.

FIG. 7 shows the construction of a delay-locked loop circuit using a phase inversion locking algorithm in accordance with an embodiment of the present invention, FIG. 8 shows the construction of the 3-stage DCDL shown in FIG. 7, FIG. 9A shows the construction of an SAR controller, and FIG. 9B is a signal flowchart according to the operation of the SAR controller shown in FIG. 9A.

Referring to FIGS. 7 to 9B, in the present embodiment, a Digitally-Controlled Delay Line (DCDL) 140 uses a 3-stage DCDL. In order to obtain high delay resolution, the 3-stage DCDL 140 includes a first coarse DCDL 141 configured to include a Lattice Delay Unit (LDU) based on Feedback Delay Units (FDU), a second coarse DCDL 142 configured to include LDUs, and a Fine Delay Line (FDL) 143 based on an FDU. The first coarse DCDL 141 is connected to the output terminal of a multiplexer 130, the second coarse DCDL 142 is connected to the rear end of the first coarse DCDL 141, and the FDL 143 is connected to the rear end of the second coarse DCDL 142.

The first coarse DCDL 141 includes an LDU based on a plurality of FDUs. Since the first coarse DCDL 141 is based on the FDUs, a great delay time can be generated using an area smaller than that of a conventional LDU. The LDU based on the FDUs has a unit delay time that is twice the unit delay time of the LDU that forms the second coarse DCDL 142.

The second coarse DCDL 142 includes a plurality of LDUs. Each of the LDUs has a unit delay time corresponding to a total delay time generated by the FDL 143 based on the FDU.

The FDL 143 includes a 4-bit FDU and two inverters 1'st INV and 2'nd INV. The unit delay time of the FDL 143 is equal to $\frac{1}{2^4}$ times the LDU.

The phase detector (PD) 150 compares the phase of an input clock signal $IN_{CLK}$ with the phase of an output clock signal $OUT_{CLK}$ and generates a phase comparison signal Comp and a lock determination signal Lock. The phase comparison signal Comp controls the output of digital control bits Q[8:0] of a variable SAR 160. If the output clock signal $OUT_{CLK}$ precedes the input clock signal $IN_{CLK}$, the phase comparison signal Comp has a value of '0'. If the input clock signal $IN_{CLK}$ precedes the output clock signal $OUT_{CLK}$, the phase comparison signal Comp has a value of '1'. The lock determination signal Lock is input to an SAR controller 180. If a phase error between the input clock signal $IN_{CLK}$ and the output clock signal $OUT_{CLK}$ is reduced within a specific set range, the lock determination signal Lock has a value of '1'. If a phase error between the input clock signal $IN_{CLK}$ and the output clock signal $OUT_{CLK}$ is not reduced within the specific set range, the lock determination signal Lock has a value of '0'.

In the present embodiment, a 9-bit variable SAR is used as the variable SAR 160, and a 4-to-16 thermometer decoder is used as the 4-to-16 decoder 170.

The SAR controller 180 receives the lock determination signal Lock generated by the phase detector 150 and a binary search completion signal Stop generated by the 9-bit variable SAR 160.

If the lock determination signal Lock has a value of '0' when the binary search completion signal Stop of '1' is output, the SAR controller 180 determines that the 3-stage DCDL 140 controlled by current valid output bits Q[N:0] (6≤N≤8) does not generate a delay time for phase synchronization, outputs a reset signal Reset of '0' so that the 9-bit variable SAR 160 is reset, and then increases the valid output bits Q[N:0] (6≤N≤8) by 1 bit (i.e., N+1).

When the 9-bit variable SAR 160 is reset, the value of the binary search completion signal Stop changes to '0' and the value of the reset signal Reset returns to '1' again.

If the lock determination signal Lock has a value of '1' when the binary search completion signal Stop of '1' is output, the SAR controller 180 determines that maintains the reset signal Reset to an existing value so that the operation of the 9-bit variable SAR 160 is stopped.

Furthermore, if a value of the lock determination signal Lock changes to '0' when a value of the binary search completion signal Stop is maintained to '1' and the operation of the 9-bit variable SAR 160 is stopped, the SAR controller 180 generates a counter mode signal $VSAR_{CM}$ that switches the 9-bit variable SAR 160 from binary search mode to sequential search mode.

The 9-bit variable SAR 160 performs a binary bit search or a sequential bit search in response to the phase comparison signal Comp generated by the phase detector 150. Lower 4 bits Q[3:0]) of digital control bits output by the 9-bit variable SAR 160 control the FDL 143 of the 3-stage DCDL 140, and Q[4] of the digital control bits controls the second coarse DCDL 142 of the 3-stage DCDL 140. Upper 4 bits Q[8:5] of the digital control bits output by the 9-bit variable SAR 160 are input to the 4-to-16 decoder 170 and converted into thermometer codes T[15:0], thus controlling the first coarse DCDL 141 of the 3-stage DCDL 140. In order to solve a harmonic-lock problem, the 9-bit variable SAR 160 controls the 3-stage DCDL 140 using only 7 bits Q[6:0] at the early stages.

If the reset signal Reset generated by the SAR controller 180 is '0', all the digital control bits Q[8:0] are set to '0'. After the number of valid output bits is increased by 1 bit, a binary search is performed again. Such an operation is repeated until a delay time generated through the 3-stage digital delay line 140 is increased by a delay time required for a lock. Furthermore, if the counter mode signal $VSAR_{CM}$ generated by the SAR controller 180 is '1', the 9-bit variable SAR 160 switches from counter mode to mode and performs a sequential bit search.

The 4-to-16 decoder 170 converts upper 4 bits Q[8:5] of the digital control bits Q[8:0], output by the 9-bit variable SAR 160, from binary codes to thermometer codes T[15:0] and outputs the converted codes. The output thermometer codes control the first coarse DCDL 141.

Figure 10:
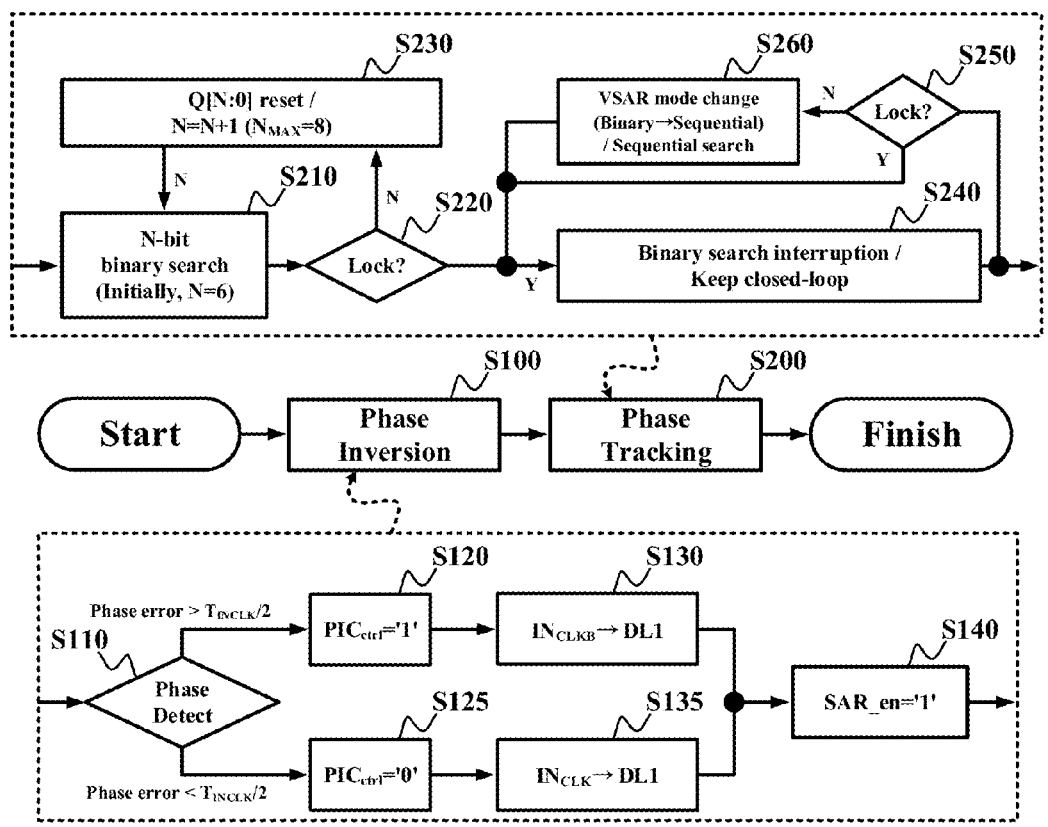
FIG. 10 is a flowchart illustrating the operation of the delay-locked loop circuit using a phase inversion locking algorithm in accordance with an embodiment of the present invention.

FIG. 10 is a flowchart illustrating the operation of the delay-locked loop circuit using a phase inversion locking algorithm in accordance with an embodiment of the present invention.

Referring to FIG. 10, when the delay-locked loop circuit starts its operation, it performs the process of determining whether or not to use the phase inversion locking algorithm. After whether or not to perform the phase inversion locking algorithm is determined, an input clock signal or an inverted input clock signal is selected and used as the input clock signal of the delay-locked loop circuit at step S100. Thereafter, the delay-locked loop circuit performs the phase synchronization process at step S200.

The process of determining whether or not to use the phase inversion locking algorithm (S100) is first described below.

The generation of rising edges of the first input clock signal $IN_{CLK}$ and the output clock signal $OUT_{CLK}$ is detected, and the phase inversion determination unit starts its operation performs a process of comparing the phase of the input clock signal with the phase of the output clock signal at step S110.

At step S110, the phase inversion determination unit determines whether or not to use the phase inversion locking algorithm by determining whether or not a phase error between the input clock signal and the output clock signal is greater than the half cycle of the input clock signal. If, as a result of the determination, it is determined that a phase error between the input clock signal and the output clock signal is greater than the half cycle of the input clock signal, the phase inversion determination unit determines to use the phase inversion locking algorithm at step S120. If, as a result of the determination, it is determined that a phase error between the input clock signal and the output clock signal is not greater than the half cycle of the input clock signal, the phase inversion determination unit determines to not use the phase inversion locking algorithm at step S125.

That is, if a phase error between the input clock signal and the output clock signal is greater than the half cycle of the input clock signal, the phase inversion determination unit generates the phase inversion determination signal $PIC_{ctrl}$ of '1' at step S120. In response thereto, the delay-locked loop circuit performs the phase synchronization process using the phase inversion locking algorithm. If it is determined that the phase inversion locking algorithm is used, the inverted input clock signal $IN_{CLKB}$ is selected as the input clock signal of the delay-locked loop circuit through the inverter at step S130, and the variable SAR starts its operation at step S140.

If a phase error between the input clock signal and the output clock signal is less than the half cycle of the input clock signal, the phase inversion determination unit generates the phase inversion determination signal $PIC_{ctrl}$ of '0' at step S125. In such a case, the delay-locked loop circuit performs the phase synchronization process without using the phase inversion locking algorithm. If it is determined that the phase inversion locking algorithm is not used, the original input clock signal is selected as the input clock signal of the delay-locked loop circuit at step S135, and the variable SAR starts its operation at step S140.

Thereafter, the delay-locked loop circuit performs the phase synchronization process at step S200.

The phase synchronization process S200 is described below. First, the delay-locked loop circuit starts its operation in binary search mode at step S210. The delay-locked loop circuit performs a binary search using the variable SAR. The variable SAR generates output digital bits for removing a phase error between the input clock signal (or the inverted input clock signal) and the output clock signal by performing a binary search while sequentially increasing valid output digital bits within a predetermined number.

Thereafter, the delay-locked loop circuit performs a process of determining whether or not a phase error between the input clock signal (or the inverted input clock signal) and the output clock signal has been removed within target delay resolution (i.e., has been locked) at step S220.

If, as a result of the determination, it is determined that a phase error between the input clock signal (or the inverted input clock signal) and the output clock signal has not been removed within the target delay resolution, the delay-locked loop circuit restarts an operation in binary search mode. That is, the delay-locked loop circuit resets the variable SAR, increases the valid output digital bits by 1 bit, and performs a binary search again. If all available valid output digital bits have been used, the delay-locked loop circuit determines that an input clock signal out of a frequency region in which the delay-locked loop circuit may operate has been received, and thus the delay-locked loop circuit is initialized at step S230.

If, as a result of the determination, it is determined that a phase error between the input clock signal (or the inverted input clock signal) and the output clock signal has been removed within the target delay resolution, the delay-locked loop circuit interrupts the binary search operation and maintains a closed circuit at step S240.

Thereafter, the delay-locked loop circuit continues to perform the process of determining whether or not a phase error has occurred between an input clock signal and an output clock signal at step S250.

If, as a result of the determination, it is determined that a phase error has occurred between the input clock signal and the output clock signal due to a change in the phase of the input clock signal attributable to an external factor or process, a change in power supply voltage, or a temperature change, the variable SAR switches its operation from binary search mode to sequential search mode and removes the phase error at step S260.

Figure 11:
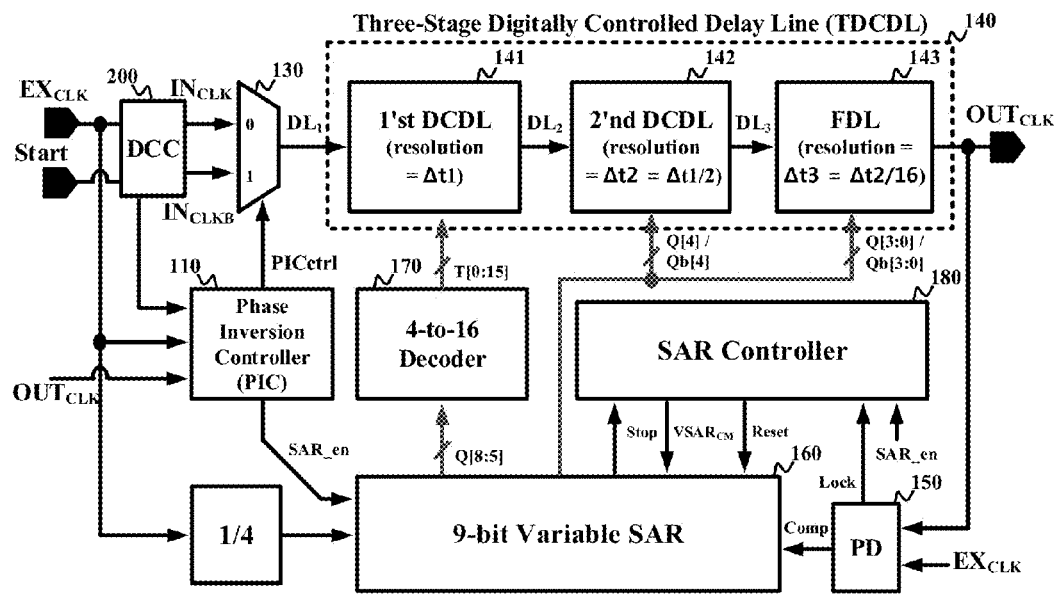
FIG. 11 shows the construction of a delay-locked loop circuit using a phase inversion locking algorithm in accordance with another embodiment of the present invention.

FIG. 11 shows the construction of a delay-locked loop circuit using a phase inversion locking algorithm in accordance with another embodiment of the present invention.

Referring to FIG. 11, the delay-locked loop circuit using a phase inversion locking algorithm according to the present embodiment includes a phase inversion controller (PIC) 110, a multiplexer 130, a DCDL 140, a phase detector (PD) 150, a 9-bit variable SAR 160, a 4-to-16 decoder 170, an SAR controller 180, and a Duty Correction Circuit (DCC) 200. The present embodiment is different from the previous embodiment in that it further includes the DCC 200, and the remaining elements are similar to those of the previous embodiment and thus the different element is chiefly described below.

Figure 12:
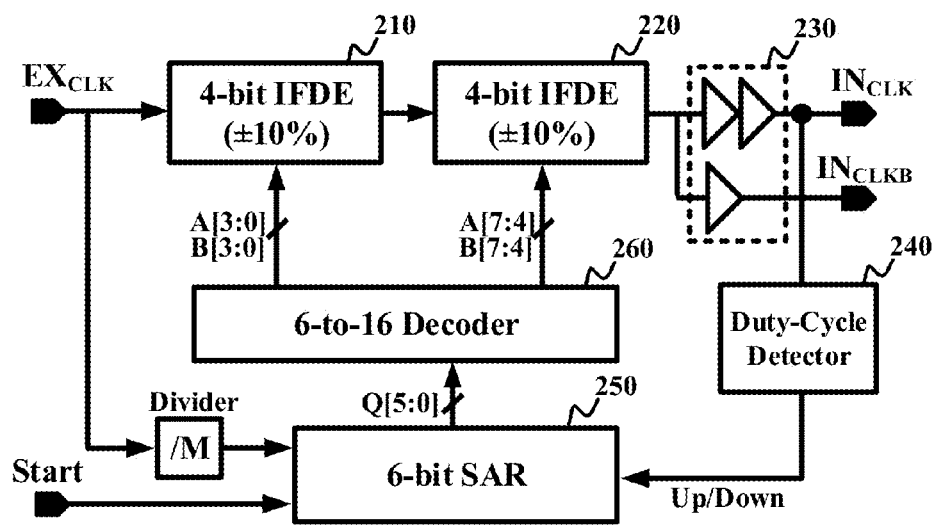
FIG. 12 shows a schematic construction of a DCC shown in FIG. 11.

FIG. 12 shows a schematic construction of the DCC 200 shown in FIG. 11.

Referring to FIG. 12, the DCC 200 using a feedback DCC according to the present embodiment includes a first 4-bit IFDE 210, a second 4-bit IFDE 220, a buffer 230, a duty cycle detector 240, a duty correction SAR 250, a duty correction decoder 260, a duty correction multiplexer (not shown) and a duty correction controller (not shown).

Each of the IFDEs controls the duty cycle of an input clock signal by controlling the rising time or falling time of an input clock signal $EX_{CLK}$ in response to digital bits retrieved by the duty correction SAR 250 and generates an output clock signal $IN_{CLK}$ of a 50% duty cycle. In the present embodiment, the two IFDEs have been illustrated as being used, but the number of IFDEs is not limited. The number of IFDEs may be freely determined to be 1 or 3 or more depending on a range required to correct the duty cycle of an input clock signal.

The buffer 230 is disposed in the rear of the 4-bit IFDE 201 and configured to output a duty-corrected clock, received from the 4-bit IFDE, to its output terminal. Here, the buffer 230 forms a clock distribution network by strongly driving duty-corrected clock signal output by the 4-bit IFDE.

The duty cycle detector 240 receives the output clock signal $IN_{CLK}$, determines the duty cycle of the output clock signal $IN_{CLK}$, determines the duty cycle of the input clock signal $EX_{CLK}$ based on a result of the determination, and then outputs a digital comparison signal Comp for controlling the binary search operation of the duty correction SAR 250.

The duty cycle detector 240 includes a charge pump (not shown) and a comparator (not shown). The charge pump generates analog differential control voltages V/Vb in response to the duty cycle of the input clock signal. In the present embodiment, if the duty cycle of the input clock signal is 50% or more, the analog control voltage V has a value greater than the analog control voltage Vb. If the duty cycle of the input clock signal is less than 50%, the analog control voltage Vb has a value greater than the analog control voltage V. The comparator is disposed in the rear of the charge pump and is configured to compare the analog differential control voltage V with the analog differential control voltage and outputs a digital value of '0' if a result of the comparison is found to be '1'. The duty cycle detector 240 outputs the digital comparison signal Comp having a digital value of '1' if the duty cycle of the input clock signal is 50% or more and outputs the digital comparison signal Comp having a digital value of '0' if the duty cycle of the input clock signal is less than 50%. That is, the duty cycle detector 240 outputs a 'High' value when the duty cycle of the input clock signal is 50% or more and outputs a 'Low' value when the duty cycle of the input clock signal is less than 50%.

The duty correction controller determines whether each of the IFDEs will be driven in duty correction mode or buffer mode by comparing a duty correction range of the input clock signal with a duty correction range of each of the IFDEs based on a result received from the duty cycle detector 240 and outputs a control signal based on a result of the determination. That is, if a duty correction range of the input clock signal falls within a duty correction range of the first 4-bit IFDE 210, the duty correction controller 290 outputs the control signal so that the first 4-bit IFDE 210 operates in duty correction mode and the second 4-bit IFDE 220 operates in buffer mode. That is, if a duty correction range of the input clock signal does not fall within a duty correction range of the first 4-bit IFDE 210, the duty correction controller outputs the control signal so that both the first and the second 4-bit IFDEs operate in duty correction mode.

The duty correction SAR 250 receives the output signal of the duty cycle control unit and generates digital bits suitable for correcting the duty cycle of the 4-bit IFDE in binary search mode.

In the present embodiment, a 6-bit SAR is used as the duty correction SAR 250. The 6-bit SAR outputs digital bits Q[5:0] in binary search mode. In binary search mode, a bit search time rapidly increases linearly according to resolution because the digital value of each bit is determined to be '1' or '0' sequentially from the most significant bit to the least significant bit.

The duty correction decoder 260 receives the digital bits Q[5:0] from the 6-bit SAR 250, converts the digital bits Q[5:0] into digital bits having code suitable for controlling the 4-bit IFDE, and outputs the converted digital bits. In the present embodiment, the duty correction decoder 260 converts the binary code digital bits Q[5:0], generated by the 6-bit SAR 250, into digital bits A[7:0] and B[7:0] having code suitable for the 4-bit IFDE and outputs the converted digital bits.

The duty correction multiplexer selectively inputs digital bits, output by the duty correction decoder 260, to the 4-bit IFDE in response to values of the digital bits of the duty correction SAR 250. In the present embodiment, the duty correction multiplexer has been illustrated as selectively inputting the digital bits A[7:0] and B[7:0], output by the duty correction decoder 160, to the 4-bit IFDE 201 in response to values of the digital bits Q[5:0] of the 6-bit SAR 250.

Figure 13:
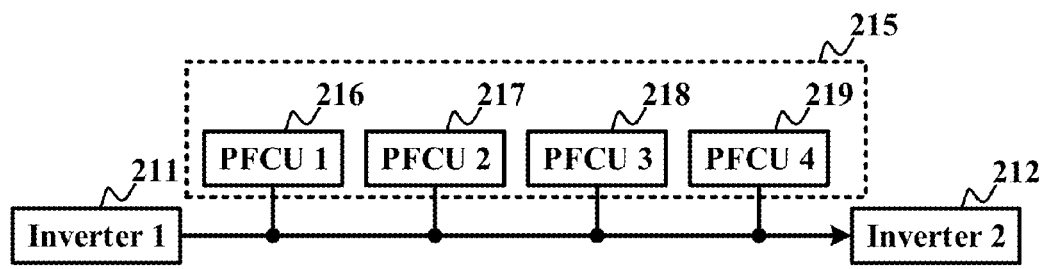
FIG. 13 is a functional block diagram showing an example of a first 4-bit IFDE shown in FIG. 12.
Figure 14:
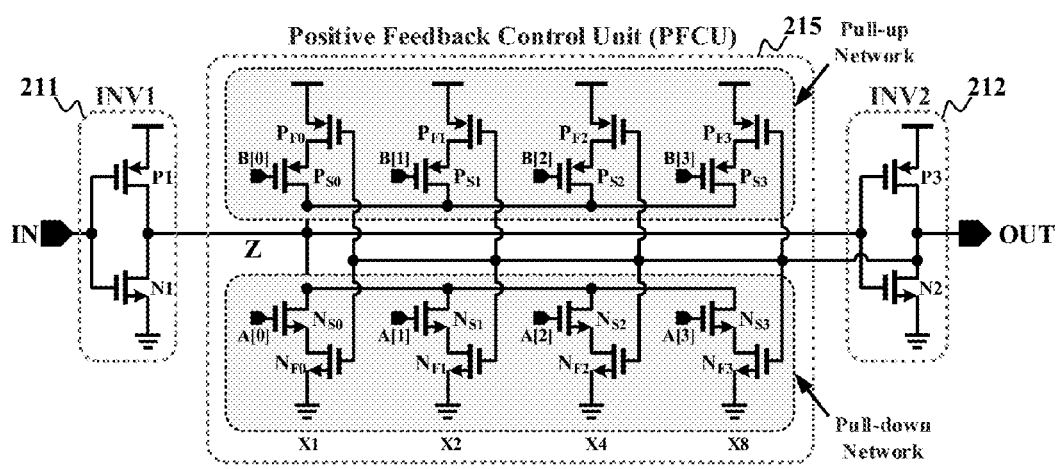
FIG. 14 is a circuit diagram showing the first 4-bit IFDE shown in FIG. 13.
Figure 15:
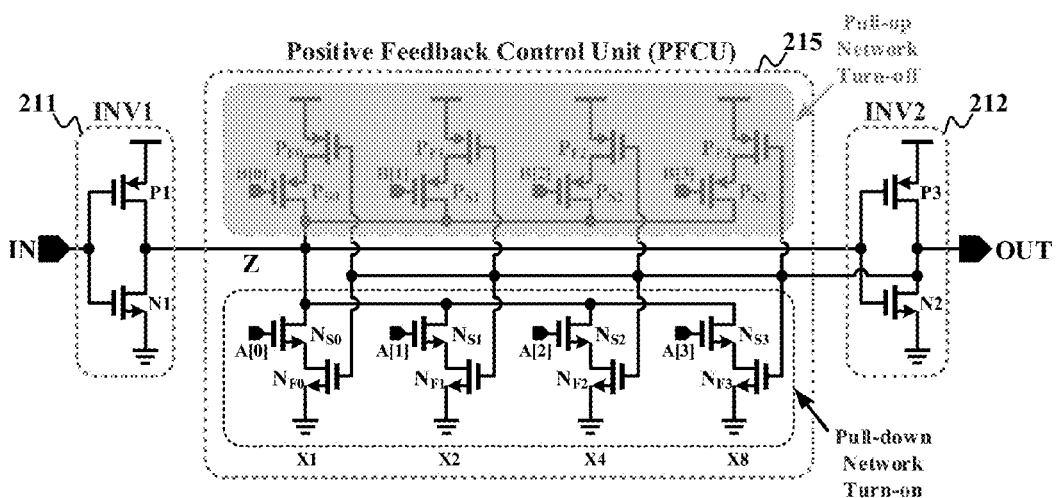
FIG. 15 is an operation conceptual diagram showing an operating principle in which the 4-bit IFDE shown in FIG. 12 corrects the duty cycle.
Figure 15:
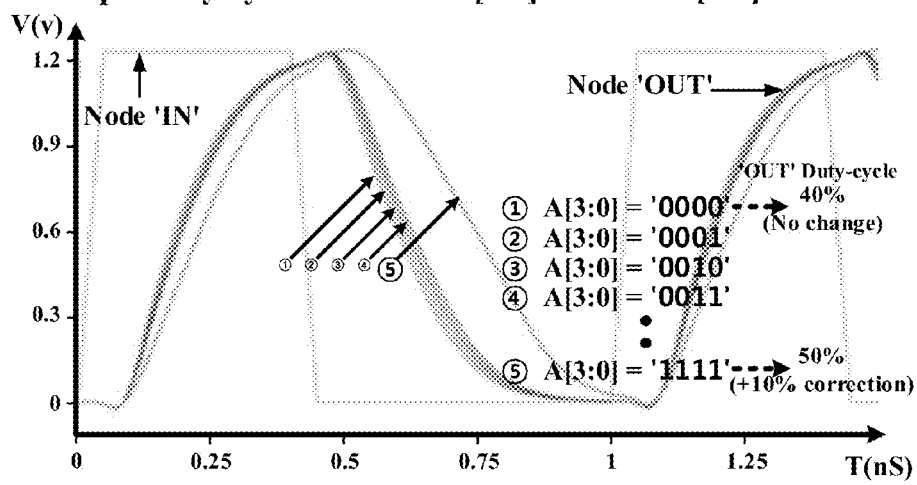

FIG. 13 is a functional block diagram showing an example of the first 4-bit IFDE 210 shown in FIG. 12, FIG. 14 is a circuit diagram showing the first 4-bit IFDE 210 shown in FIG. 13, and FIG. 15 is an operation conceptual diagram showing an operating principle in which the 4-bit IFDE 210 shown in FIG. 12 corrects the duty cycle. The second 4-bit IFDE 220 has the same construction of the first 4-bit IFDE 210, and a description of the second 4-bit IFDE 220 is omitted.

Referring to FIGS. 13 and 14, the first 4-bit IFDE 210 includes a first inverter 211, a positive feedback control section 215 including a plurality of Positive Feedback Control Units (PFCUs), and a second inverter 212. In the present embodiment, the positive feedback control section 215 has been illustrated as including four PFCUs, that is, a first PFCU 216, a second PFCU 217, a third PFCU 218, and a fourth PFCU 219.

The first inverter 211 receives the input clock signal $EX_{CLK}$ and outputs an inversion clock signal. The positive feedback control section 215 is connected to the output terminal of the first inverter 211, and the second inverter 212 is connected to the rear end of the positive feedback control section 215.

The input terminal of the second inverter 212 is connected to the output terminal of the first inverter 211. The second inverter 212 receives the output signal of the first inverter 211, and the output terminal of the second inverter 212 is connected to the control stage of the positive feedback control section 215. The positive feedback control section 215 includes switching transistors. The operations of the switching transistors are controlled in response to digital bits output by the duty correction SAR 250, the duty correction decoder 260, and the duty correction multiplexer 270, so the amount of current of the positive feedback control section 215 is controlled. As a result, the rising time or falling time of the input clock signal is controlled, and thus the duty cycle of the input clock signal is corrected and output.

Each of the PFCUs of the positive feedback control section 215 includes two P type switching transistors and two N type switching transistors. Since all the PFCUs have the same construction, only the construction of the first PFCU 216 is described below representatively. The first PFCU 216 includes two P type switching transistors P4 and P0 and two N type switching transistors N0 and N4. One of the source/drain terminals of the P type switching transistor P4 of the first PFCU 216 is connected to a power supply terminal, and the other thereof is connected to one of the source/drain terminals of the P type switching transistor P0. The other of the source/drain terminals of the P type switching transistor P0 is connected to one of the source/drain terminals of the N type switching transistor N0, and the source/drain terminals of the N type switching transistor N4 are connected to the source/drain terminals of the N type switching transistor N0 and the ground, respectively. The gate terminal of the P type switching transistor P0 is supplied with a digital bit B[0] as a control signal, and the gate terminal of the N type switching transistor N0 is supplied with a digital bit A[0] as a control signal. The gate terminal of the P type switching transistor P0 and the N type switching transistor N4 are connected, and the gate terminals of the P type switching transistor P4 and the N type switching transistor N4 are connected to the output terminal of the second inverter 112.

The first 4-bit IFDE 210 of the 4-bit IFDE operates as the buffer including two inverters simply when all the switching transistors N0 to N3 and P0 to P3 are turned off. Thereafter, when the digital bits A[7:0] and B[7:0] are generated, the switching transistors N0 to N3 and P0 to P3 of the 4-bit IFDE are turned on, and thus the duty correction function is activated.

The principle that the duty cycle is corrected is described below with reference to FIG. 15. When an input clock signal having a duty cycle of less than 50% is input to the 4-bit IFDE, the duty cycle is corrected by controlling the P type switching transistors P0 to P3. When the P type switching transistors P0 to P3 are turned on, a feedback current that flows from the power supply to a node Z is increased, thereby delaying the time that is taken for voltage at the node Z to be changed to the ground. A greater duty cycle can be corrected as the number of P type switching transistor P0 to P3 that are turned on is increased.

In contrast, when an input clock signal having a duty cycle of 50% or more is input to the 4-bit IFDE, the duty cycle is corrected by controlling the N type switching transistors N0 to N3. When the N type switching transistors N0 to N3 are turned on, a feedback current that flows from the node Z to the ground is increased, thereby delaying the time that is taken for voltage at the node Z to be changed to the supply voltage.

Figure 16:
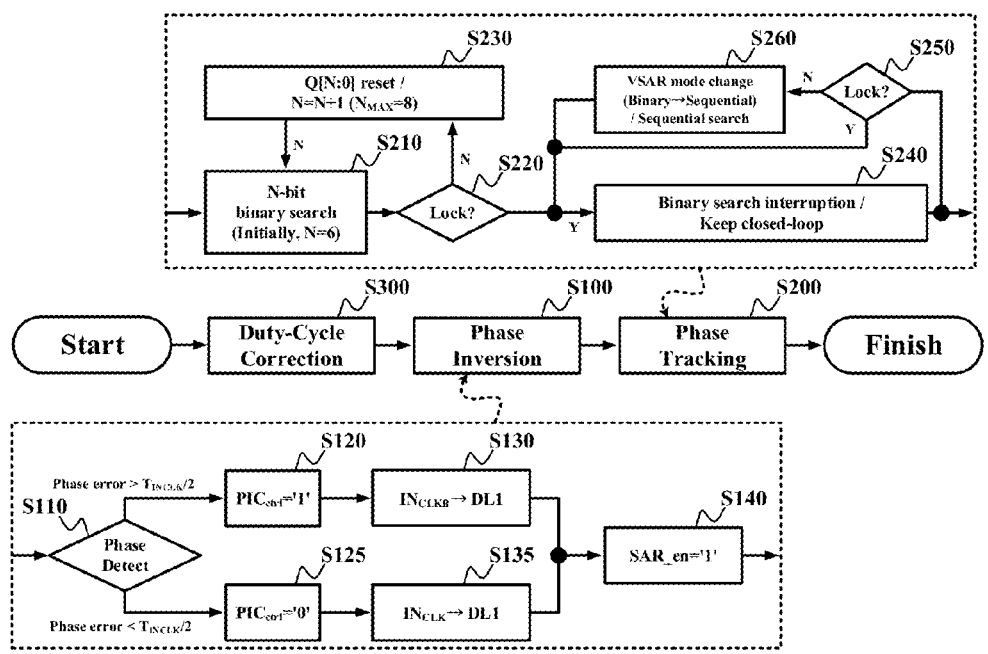
FIG. 16 is a flowchart illustrating the operation of the delay-locked loop circuit using a phase inversion locking algorithm in accordance with another embodiment of the present invention.
Figure 17:
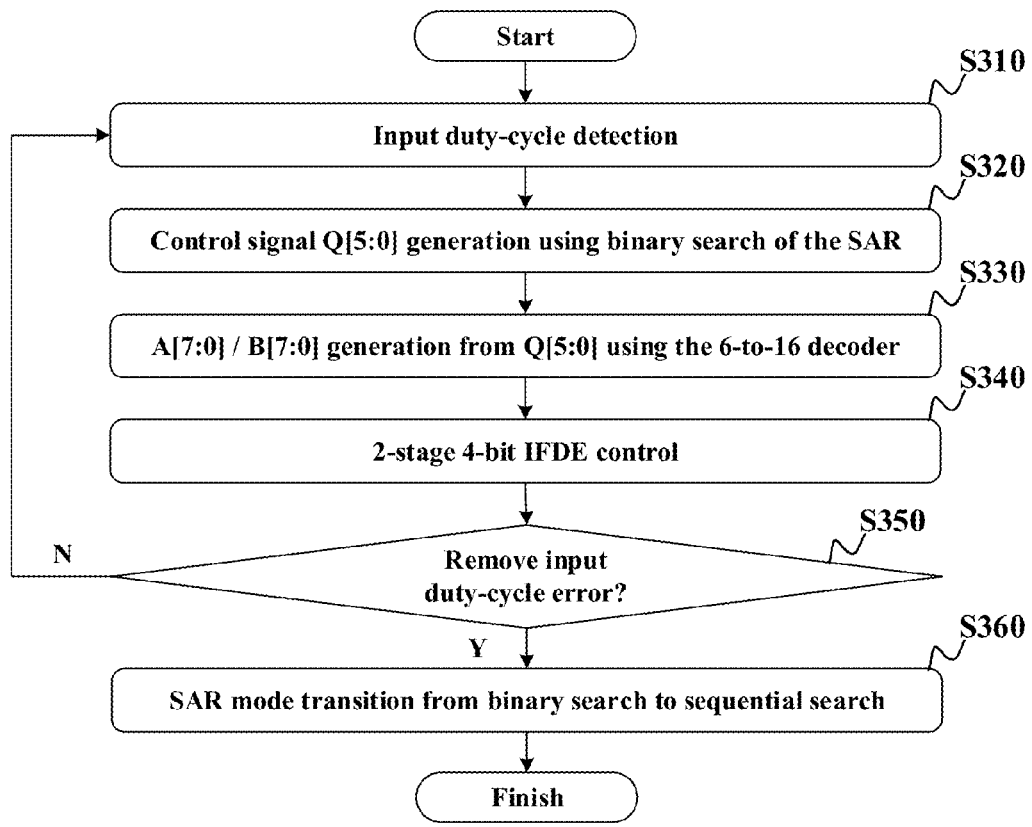
FIG. 17 is a flowchart illustrating a method of controlling a digital Duty Correction Circuit (DCC) using the 4-bit IFDE in accordance with an embodiment of the present invention.

FIG. 16 is a flowchart illustrating the operation of the delay-locked loop circuit using a phase inversion locking algorithm in accordance with another embodiment of the present invention, and FIG. 17 is a flowchart illustrating a method of controlling the digital DCC using the 4-bit IFDE in accordance with an embodiment of the present invention.

Referring to FIG. 16. First, the delay-locked loop circuit performs digital duty correction using the 4-bit IFDE at step S300. Next, when the operation of the delay-locked loop circuit starts, it performs a process of determining whether or not to use a phase inversion locking algorithm. When whether or not to use the phase inversion locking algorithm is determined, an input clock signal or an inverted input clock signal is selected and used as the input clock signal of the delay-locked loop circuit at step S100. Thereafter, the delay-locked loop circuit performs a phase synchronization process at step S200. The processes S100 and S200 are the same as those of FIG. 10, and thus the process S300 is chiefly described herein.

Referring to FIG. 17, when the operation of the digital DCC 200 using the 4-bit IFDE is initiated, first, the digital DCC detects the duty cycle of an input clock signal at step S310. The duty cycle detector 240 detects the duty cycle of an output clock signal, detects the duty cycle of the input clock signal from the detected duty cycle of the output clock signal, and sends the detected results to the duty correction controller 290.

Thereafter, the duty correction SAR 250 generates digital bits Q[5:0] suitable for the operation of the 4-bit IFDE through a binary search and outputs the digital bits Q[5:0] at step S320. The duty correction controller 290 determines the number of IFDEs required to correct the duty cycle based on the results received from the duty cycle detector 240. The duty correction controller 290 compares a duty correction range of the input clock signal with a duty correction range of each IFDE, determines whether each IFDE will be driven in duty correction mode or buffer mode based on a result of the comparison, and outputs the control signal. Furthermore, the duty correction controller 290 generates a control signal for controlling the rising time or falling time of the input clock signal. The duty correction controller 290 generates a control signal for controlling the amount of a feedback current of the IFDE that will be driven in duty correction mode in response to the duty cycle of the input clock signal. The duty correction SAR 250 generates digital bits suitable for the operation of the 4-bit IFDE through a binary search and outputs the digital bits.

Thereafter, the digital bits are converted into digital bits having code through the duty correction decoder 260 at step S330, and the duty correction multiplexer 270 selectively inputs the converted digital bits to the 4-bit IFDE at step S340.

Thereafter, the 4-bit IFDE corrects the duty cycle, outputs the output clock signal, and determines whether or not the duty cycle error of the input clock signal has been removed at step S350.

If, as a result of the determination, it is determined that the duty cycle error of the input clock signal has not been removed, the 4-bit IFDE returns to step S310. If, as a result of the determination, it is determined that the duty cycle error of the input clock signal has been removed, the 4-bit IFDE switches the operation of the duty correction SAR 250 from binary search mode to sequential search mode and completes the entire operation at step S360.

Figure 18:
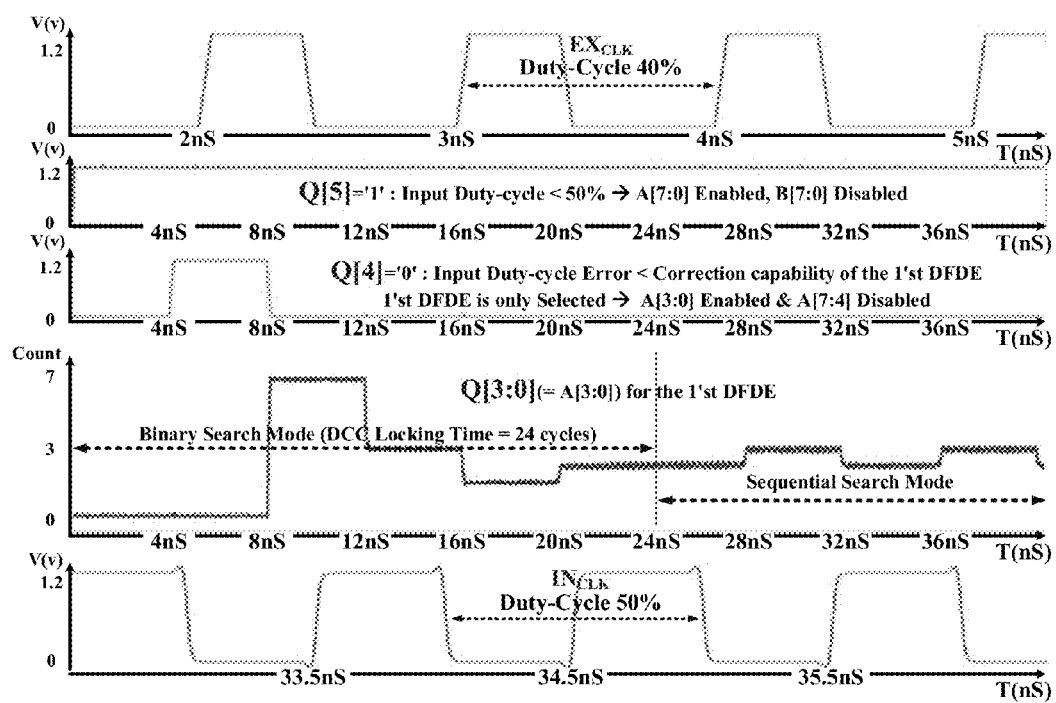
FIG. 18 shows the simulation results of the operation of the digital DCC using the 4-bit IFDE.

FIG. 18 shows the simulation results of the operation of the digital DCC using the 4-bit IFDE. It is assumed that an operating frequency is 1 GHz and the duty cycle of an input clock signal is 40%. The binary bit search operation of the 6-bit SAR 250 is controlled in response to the digital comparison signal Comp generated by the duty cycle detector 240. In such a case, since the duty cycle of the input clock signal is less than 50%, Q[5] has a digital value of '1'. Accordingly, the duty correction multiplexer 270 converts all digital bits A[7:0] into digital values corresponding to '0', and thus the operation of the 4-bit IFDE is controlled by only digital bits B[7:0]. Only the first 4-bit IFDE 210 is used because Q[4] has a value of '0'. The second 4-bit IFDE 220 operates as a simple buffer in response to the digital bits B[7:4] that have been converted into the digital values of '1' through the duty correction decoder 260. Q[3:0] are directly connected to B[3:0], and they correct the duty cycle of the output clock signal by controlling the first 4-bit IFDE 210. After completing the operation in binary search mode, the 6-bit SAR 250 switches to sequential search mode and forms a closed loop. After the operation is completed, the output clock signal has a duty cycle of 50%.

As described above, if a phase synchronization process is performed using an inverted input clock signal in accordance with a phase inversion locking algorithm as in the present invention, the amount of generated delay time can be reduced almost by half to a maximum extent. Accordingly, the delay-locked loop circuit having a wide operating frequency range, a short locking time, low power, a small chip area, and an improved jitter characteristic can be provided.

Furthermore, since the digital DCC is additionally configured, there is an advantage in that a phenomenon in which the operating frequency range of the delay-locked loop circuit is reduced due to a duty cycle error of an input clock signal when a phase inversion locking algorithm is used can be eliminated.

The delay-locked loop circuit using a phase inversion locking algorithm and the method of controlling the same in accordance with embodiments of the present invention are only illustrative, and those skilled in the art will appreciate that the present invention may be modified in various ways without departing from the scope and spirit of the invention as disclosed in the accompanying claims.

What is claimed is:

1. A delay-locked loop circuit using a phase inversion locking algorithm, comprising:
   a phase inversion controller configured to control whether or not to use the phase inversion locking algorithm by determining a phase error between an input clock signal and an output clock signal;
   an inverter configured to invert the input clock signal and output the inverted input clock signal;
   a multiplexer configured to receive the input clock signal and the inverted input clock signal of the inverter and output the input clock signal in response to a control signal of the phase inversion controller or the inverted input clock signal; and
   a delay-locked loop connected to an output terminal of the multiplexer and configured to perform phase synchronization in response to the output signal of the multiplexer.

2. The delay-locked loop circuit of claim 1, wherein the phase inversion controller determines the phase error between the input clock signal and the output clock signal and performs control so that the phase inversion locking algorithm is used if, as a result of the determination, it is determined that the phase error between the input clock signal and the output clock signal is greater than a half cycle of the input clock signal.

3. The delay-locked loop circuit of claim 1, wherein the phase inversion controller comprises:
   a clock generation detector configured to detect a generation of rising edges of a first input clock signal and an output clock signal and control a start of an operation of a phase inversion determination unit; and
   the phase inversion determination unit configured to start an operation under a control of the clock generation detector and control the multiplexer so that the phase inversion locking algorithm is used if a phase error between the input clock signal and the output clock signal is greater than a half cycle of the input clock signal.

4. The delay-locked loop circuit of claim 1, wherein the delay-locked loop comprises a Digitally-Controlled Delay Line (DCDL) configured to receive the input clock signal or the inverted input clock signal from the multiplexer and reduce the phase error between the input clock signal and the output clock signal.

5. The delay-locked loop circuit of claim 4, wherein the delay-locked loop comprises:
   a phase detector configured to compare a phase of the input clock signal with a phase of the output clock signal, generate a phase comparison signal for controlling a search of output digital bits by a variable Successive Approximation Register (SAR) based on a result of the comparison, determine whether locking has been performed between the phases, and generate a lock determination signal for controlling a Successive Approximation Register (SAR) controller;
   the variable SAR configured to perform a binary bit search or a sequential bit search in response to the phase comparison signal output by the phase detector and simultaneously generate the output digital bits for removing the phase error between the input clock signal and the output clock signal; and
   the SAR controller configured to reset the variable SAR, increase a number of valid output bits, and control mode switching operation to sequential search mode in response to the phase comparison signal and a lock determination signal.

6. The delay-locked loop circuit of claim 4, wherein the DCDL comprises:
a first coarse DCDL configured to comprise a Lattice Delay Unit (LDU) based on Feedback Delay Units (FDU);
a second coarse DCDL connected to a rear end of the first coarse DCDL and configured to comprise LDUs; and
a Fine Delay Line (FDL) connected to a rear end of the second coarse DCDL and based on FDUs.

7. The delay-locked loop circuit of claim 1, further comprising Duty Correction Circuit (DCC) configured to correct a duty cycle error of the input clock signal.

8. The delay-locked loop circuit of claim 7, wherein the DCC comprises:
a 4-bit IFDE configured to comprise a plurality of IFDEs, wherein each of the IFDEs corrects the duty cycle by controlling a delay time of the input clock signal by controlling a rising time or falling time of the input clock signal;
a duty cycle detector configured to receive the output clock signal, determine a duty cycle of the input clock signal, and output a digital comparison signal for controlling an operation of the 4-bit IFDE; and
a duty correction SAR configured to receive the digital comparison signal from the duty cycle detector and generate digital bits for controlling the duty correction of the 4-bit IFDE in binary search mode.

9. The delay-locked loop circuit of claim 8, further comprising a duty correction decoder configured to receive the digital bits from the duty correction SAR, convert the received digital bits into digital bits having code suitable for the 4-bit IFDE, and output the converted digital bits.

10. The delay-locked loop circuit of claim 9, further comprising a duty correction multiplexer configured to selectively input the digital bits, output by the duty correction decoder, to the 4-bit IFDE in response to values of the digital bits generated by the duty correction SAR.

11. The delay-locked loop circuit of claim 8, further comprising a buffer disposed at a rear end of the 4-bit IFDE and configured to receive a duty-corrected clock from the 4-bit IFDE and output the duty-corrected clock to an output terminal of the buffer.

12. The delay-locked loop circuit of claim 8, wherein the duty cycle detector comprises:
a charge pump configured to generate analog differential control voltages in response to the duty cycle of the input clock signal; and
a comparator disposed at a rear end of the charge pump and configured to perform comparison on the analog differential control voltages output by the charge pump and output a result of the comparison as a digital value.

13. The delay-locked loop circuit of claim 8, wherein each of the IFDEs comprises:
a first inverter configured to receive the input clock signal and output an inverted clock signal;
a positive feedback control section configured to comprise a plurality of Positive Feedback Control Units (PFCUs); and
a second inverter connected to a rear end of the positive feedback control section.

14. The delay-locked loop circuit of claim 13, wherein:
the second inverter has an input terminal connected to an output terminal of the first inverter and receives an output signal of the first inverter,
an output terminal of the second inverter is connected to a control stage of the positive feedback control section, and
the positive feedback control section comprises switching transistors and corrects the duty cycle of the input clock signal by controlling the rising time or falling time of the input clock signal by controlling an amount of current through on and off operations of the switching transistors.

15. The delay-locked loop circuit of claim 13, wherein each of the PFCUs comprises two P type switching transistors and two N type switching transistors.

16. The delay-locked loop circuit of claim 13, further comprising at least one pair of inverters disposed between some of the plurality of PFCUs.

17. The delay-locked loop circuit of claim 8, further comprising a duty correction controller configured to compare the duty cycle of the input clock signal with a duty correction range of each of the IFDEs based on a result received from the duty cycle detector, determine whether each of the IFDEs is to be driven in duty correction mode or buffer mode, and output a control signal.

18. A method of controlling a delay-locked loop circuit using a phase inversion locking algorithm according to claim 1, the method comprising:
determining whether or not to use the phase inversion locking algorithm; and
performing a phase synchronization process when whether or not to use the phase inversion locking algorithm is determined and an input clock signal or an inverted input clock signal is selected and used as an input clock signal of the delay-locked loop circuit.

19. The method of claim 18, wherein determining whether or not to use the phase inversion locking algorithm comprises:
detecting a generation of rising edges of a first input clock signal and an output clock signal and controlling a start of an operation of a phase inversion determination unit;
determining a phase error between the input clock signal and the output clock signal;
determining whether or not to use the phase inversion locking algorithm by determining whether or not the phase error between the input clock signal and the output clock signal is greater than a half cycle of the input clock signal; and
selecting an original input clock signal as an input clock signal of the delay-locked loop circuit if, as a result of the determination, it is determined that the phase inversion locking algorithm is not used and selecting the input clock signal, inverted by an inverter, as the input clock signal of the delay-locked loop circuit if, as a result of the determination, it is determined that the phase inversion locking algorithm is used.

20. The method of claim 19, wherein performing the phase synchronization process comprises:
performing a binary search using a variable SAR;
determining whether or not a phase error between the input clock signal or the inverted input clock signal and the output clock signal has been removed within target delay resolution;
completing an operation if, as a result of the determination, it is determined that the phase error between the input clock signal and the output clock signal has been removed within the target delay resolution and determining whether or not all available valid output digital bits have been used if, as a result of the determination, it is determined that the phase error between the input clock signal and the output clock signal has not been removed; and
increasing valid output digital bits by 1 bit 1 if, as a result of the determination, all the available valid output digital bits have not been used and restarting binary search mode and resetting the delay-locked loop circuit if, as a result of the determination, all the available valid output digital bits have been used.

21. The method of claim 19, further comprising:

continuing to determine whether or not a phase error between an input clock signal and an output clock signal has occurred after an operation is completed; and changing an operation of a variable SAR from binary search mode to sequential search mode if, as a result of the determination, it is determined that a phase error has occurred between the input clock signal and the output clock signal and removing the phase error.

22. The method of claim 18, further comprising correcting a duty cycle of the input clock signal before determining whether or not to use the phase inversion locking algorithm.

* * * * *